United States Patent

Bude et al.

Patent Number: 6,011,722
Date of Patent: Jan. 4, 2000

[54] METHOD FOR ERASING AND PROGRAMMING MEMORY DEVICES

[75] Inventors: Jeffrey Devin Bude, New Providence; Marco Mastrapasqua, Annandale, both of N.J.

[73] Assignee: Lucent Technologies Inc., Murray Hill, N.J.

[21] Appl. No.: 09/170,819

[22] Filed: Oct. 13, 1998

[51] Int. Cl.⁷ .................................................. G11C 16/04
[52] U.S. Cl. ............................ 365/185.24; 365/185.26; 365/185.18
[58] Field of Search ...................... 365/185.24, 185.26, 365/185.29, 185.14, 218, 185.18

[56] References Cited

U.S. PATENT DOCUMENTS

| | | | |
|---|---|---|---|
| 5,042,009 | 8/1991 | Kazerounian et al. | 365/185 |
| 5,222,040 | 6/1993 | Challa | 365/185 |
| 5,278,439 | 1/1994 | Ma et al. | 257/319 |
| 5,327,378 | 7/1994 | Kazerounian | 365/185 |
| 5,349,220 | 9/1994 | Hong | 257/322 |
| 5,357,476 | 10/1994 | Kuo et al. | 365/218 |
| 5,364,806 | 11/1994 | Ma et al. | 437/43 |
| 5,381,051 | 1/1995 | Morton | 327/390 |
| 5,390,068 | 2/1995 | Schultz et al. | 361/95 |
| 5,394,365 | 2/1995 | Tsukikawa | 365/189.09 |
| 5,412,603 | 5/1995 | Schreck et al. | 365/189.01 |
| 5,487,033 | 1/1996 | Keeney et al. | 265/185.19 |
| 5,491,657 | 2/1996 | Haddad et al. | 365/185.27 |
| 5,511,021 | 4/1996 | Bergemont et al. | 365/185.03 |
| 5,546,340 | 8/1996 | Hu et al. | 365/185.3 |
| 5,600,593 | 2/1997 | Fong | 365/185.19 |
| 5,617,357 | 4/1997 | Haddad et al. | 365/185.27 |
| 5,638,327 | 6/1997 | Dallabora et al. | 365/185.33 |
| 5,681,770 | 10/1997 | Ogura et al. | 437/43 |
| 5,699,306 | 12/1997 | Lee et al. | 365/200 |

OTHER PUBLICATIONS

Oshima, Y. et al., "Process and Device Technologies for 16Mbit EPROMs with Large–Tilt Angle Implanted P–Packet Cell," IEDM Tech. Dig., pp. 95–98 (1990).

Atsumi, S. et al., "Fast Programmable 256K Read Only Memory with On–Clip Test Circuits," IEEE J. Solid–State Circuits, vol. SC–20, No. 1, pp. 422–427 (Feb. 1985).

Bill, C.S. et al., "A Temperature– and Process– Tolerant 64K EEPROM," IEEE J. Solid–State Circuits, vol. SC–20, No. 5, pp. 979–985 (Oct. 1985).

Tsuji, N. et al., "New Erase Scheme for DINOR Flash Memory," IEEE, IEDM 94–53, pp. 3.4.1–3.4.4. (1994).

Kazerounlan, R. et al., "A 5 Volt High Density Poly–Poly Erase Flash EPROM Cell," IEDM Tech. Dig., pp. 36–439 (1988).

Onada, H. et al., "A Novel Cell Structure Suitable for a 3 Volt Operation, Sector Erase Flash Memory," IEDM 92–599, pp. 24.3.1–24.3.4. (1992).

(List continued on next page.)

Primary Examiner—David Nelms
Assistant Examiner—David Lam
Attorney, Agent, or Firm—Richard J. Botos

[57] ABSTRACT

A method for programming and/or erasing an array of stacked gate memory devices such as EPROM and EEPROM devices in a NOR array is disclosed. In the method, either a program verify or an erase verify is performed intermittently with the programming of a device or the erasure of the array. During the program-verify, one of either a negative $V_{CS}$ is applied to the deselected devices in the array, a negative $V_{BS}$ is applied to both the selected and deselected devices in the array, or both conditions are applied. Performing the program verify or erase verify in this manner is efficient and accurate. During the programming step, it is also advantageous if one of either a negative $V_{CS}$ is applied to the deselected devices in the array, a negative $V_{BS}$ is applied to the selected devices in the array, or both. With the application of a negative $V_{CS}$ to the deselected devices during programming, if there are any over-erased devices in the array, the presence of the over-erased devices will not adversely affect the programming of the devices.

28 Claims, 2 Drawing Sheets

OTHER PUBLICATIONS

Murray H. Woods, "An E-PROM's integrity starts with its cell structure," Electronics Magazine, pp. 59–68, Aug. 1980.

Kurt Robinson, "Endurance Brightens the Future of Flash," Electronic Component News, pp. 167169, Nov. 1988.

Chenming Hu, "Nonvolatile Semiconductor Memories," IEEE Electron Devices Society, pp. 1–9. (1989).

Dov Frohman–Bentchkowsky, "A Fully Decoded 2048–Bit Electrically Programmable FAMOS Read–Only Memory," IEEE J. Solid State Circuits, vol. SC–6, No. 5, pp. 301–306, Oct. 1971.

Bude, et al., "EEPROM/Flash Sub 3.0V Drain–Source Bias Hot Carrier Writing," IEDM, pp. 3.7.1–3.7.3 (95–989). (1995).

METHOD FOR ERASING AND PROGRAMMING MEMORY DEVICES

TECHNICAL FIELD

The invention is directed to a method for erasing and programming electrically programmable read-only memory (EPROMs and EEPROMs) devices in a NOR architecture.

BACKGROUND OF THE INVENTION

A nonvolatile memory is a type of memory that retains stored data when power is removed. There are various types of nonvolatile memories, including read only memories (ROMs), erasable programmable read only memories (EPROMs), and electrically erasable programmable read only memories (EEPROMs). These memories have an array of individual memory devices, and an individual device in the array is also referred to as a cell. One array of devices is typically a subset of the entire memory. An EPROM is erased using ultraviolet light and an EEPROM is erased using an electrical signal. An electrical signal is used to write EPROMS and EEPROMS. In a conventional flash EEPROM ("flash" indicating all memory cells or sectors of cells are erased at once), memory cells are simultaneously erased to a low threshold voltage and then programmed, either individually or in small groups, to a high threshold voltage. EPROMs and EEPROMs are commonly used in data processing systems that require a nonvolatile memory that is reprogrammable.

A typical device structure for EEPROM cells is the floating-gate polysilicon transistor. A typical floating gate structure is illustrated in FIG. 1. As depicted in FIG. 1, a floating gate 10, sandwiched between two insulator layers 20 and 60, is between the substrate 30 and the ordinary select-gate electrode 40. The structure depicted in FIG. 1 is a stacked gate memory cell, the word "stacked" indicating that the floating gate 10 is stacked over the source 50 and drain 70 portions of the substrate. Another EPROM structure is a split gate structure wherein the portion of the floating gate only overlies the drain and no portion of the floating gate overlies the source. Split gate EPROM and EEPROM device structures are described in U.S. Pat. No. 5,349,220, to Hong which is hereby incorporated by reference. As a result, in EPROMs and EEPROMs, the select-gate voltage must be capacitively coupled in series with the floating gate rather than directly to the underlying channel.

There are n-channel and p-channel devices with the above structures. In the n-channel devices, the source and drain are doped with an n-type dopant and the substrate is doped with a p-type dopant. In p-channel devices, the source and drain contain p-type dopant and the substrate contains n-type dopant. In silicon based substrates, such as silicon or silicon germanium (SiGe) alloys, an example of a p-type dopant is boron and examples of suitable n-type dopants are arsenic and phosphorus.

EPROMS and EEPROMS are programmed by applying a set of bias voltages to the device depicted in FIG. 1. The voltage applied to the select-gate (hereinafter referred to as a control gate) is $V_C$, the voltage applied to the drain is $V_D$, and the voltage applied to the source is $V_S$. The voltage applied to the substrate is referred to as $V_B$ and, typically, all cells in an array have the same $V_B$ applied thereto. Programming, as used herein, is the addition of negative charge to the floating gate.

Voltage differences, typically referred to as biases, between these various terminals are designated in the following manner: e.g., $V_{CS}=V_C-V_S$ etc. In n-channel devices writing biases are used to introduce additional negative charge onto the floating gate, thereby writing the cell. However, if the charged state is chosen as the "unwritten" state, introducing additional negative charge onto the floating gate will erase the cell. Bias conditions that are used to introduce a more negatively charged state are different from bias conditions that are used to read the charged state or to create a more positively charged state.

These write biases are typically a high control gate-to-source voltage ($V_{CS}$) and/or a high drain-to-source voltage ($V_{DS}$). These programming voltages are sufficient to cause a transfer of electrons from the bulk of the device (channel 80 and/or source 50 and/or drain 70) region to the floating gate 10 where they are trapped, thereby charging the floating gate more negatively. Charge is trapped in the floating gate 10 because the floating gate is isolated from the select-gate 40 by an insulating oxide layer 60 and from the drain-source-substrate region by another thin oxide insulating layer 20. The effect of trapping electrons on the floating gate is to raise the threshold voltage ($V_{TH}$) to some predetermined level. Furthermore, these programming voltages are outside of the range of normal reading bias conditions so that an inadvertent write does not occur during reading.

EPROMS and EEPROMS typically include an array of floating-gate transistors. The $V_{TH}$ of a given cell can be determined by a sense amplifier when read and decoded into its logic value. For example, in a conventional two-state memory, a high $V_{TH}$ that is achieved by writing as described above is decoded as a logic one. In turn, the intrinsic $V_{TH}$ (the $V_{TH}$ of a device, which has not been written by adding negative charge to the floating gate 10) is decoded as a logic zero. Because the floating gate is isolated, the cell can remain programmed or erased for periods of up to 10 years and even longer.

However, certain problems are encountered when erasing and writing stacked-gate memory cells in arrays of memory devices configured in a common architecture known as a NOR array. A NOR architecture consists of a plurality of EPROM or EEPROM cells. In a NOR architecture, at least four cells are arranged such that there is a sequence of cells in two directions. The sequence of cells in the first direction are referred to as rows of cells and the sequence of cells in the second direction are referred to as columns of cells. A NOR array requires that there be at least two rows of cells and at least two columns of cells. Furthermore, in a NOR array, each column of cells has its own dedicated bit line and the drains of the cells in a given column are electrically connected to the same bit line. Still further, each row of cells has its own dedicated word line, and the gates of the cells in a given row are all electrically connected to the same word line. The sources are connected to a source voltage ($V_S$) supply. In a NOR array, more than one bit line may be selected simultaneously, but only one word line is selected at a time.

The cells in the array are programmed and read individually. A cell is "selected" for programming or reading by applying certain voltages to the word line and the bit line that are connected to the selected cell. These voltages are different from the voltages applied to the remaining cells in the array. The remaining cells in the array are deselected. For example, a selected cell is typically read by applying voltages to the word and bit lines of the selected device. Specifically, a $V_{CS}$ that is greater than a desired $V_{TH}$ is applied to the word line and a $V_{DS}$ of about one (1) volt is applied to the bit line of the selected device. Voltages applied to the remaining word and bit lines in the array result in the application of a $V_{CS}=0$ and a $V_{DS}=0$ to the deselected devices. In the following, a $V_S=0$ is assumed (but it is understood that $V_S$ can be greater than or equal to zero). When $V_S=0$, $V_{CS}=V_C$ (the voltage applied to the word line) and $V_{DS}=V_D$ (the voltage applied to the bit line). Under such conditions, the selected cell(s) are read. In addition, under normal read conditions, $V_{BS}$ is equal to zero.

Prior to the introduction of charge onto the floating gates of the cells in a NOR sub-array of memory cells, all of cells in the sub-array are erased simultaneously. When a NOR array of memory cells is erased, the $V_{TH}$ distribution in the memory will be about 2 volts wide. This requires the erase to be carefully controlled to avoid "over-erasing" cells. A cell is over-erased when its $V_{TH}$ is less than zero. A cell with a $V_{TH}$ that is less than zero cannot be deselected during read. Such a cell cannot be left in this state because it adversely affects the operation of the array.

All cells in the programmed array must have a $V_{TH}$ that is sufficiently greater than zero to be deselected by application of a $V_{CS}$ equal to zero. As used herein, $V_{TH}$ represents the charge on the floating gate of a cell and so determines the state of the cell. The following describes how values of $V_{TH}$ are decoded as on or off by the sense amplifier. As used herein, $V_{TH}$ is the voltage of the device that determines whether the device is read as on or off by the sense amplifier.

$V_{TH}$ is defined here such that a sense amplifier connected to a bit line will read a device as on when $V_C$ is greater than or equal to the $V_{TH}$ of the device and $V_D$ is greater than to zero. A sense amplifier connected to a bit line will read a device as off when $V_C$ is less than the $V_{TH}$ of the device. Therefore, to the extent that cells are over-erased in a NOR array, those cells must be reprogrammed to a $V_{TH}$ greater than zero by a convergence technique. These over-erased cells cannot be written controllably using conventional channel hot electron injection techniques for introducing charge onto the floating gate because cells with a $V_{TH}$ less than zero contribute large bit-line leakage. Large bit-line leakage makes it difficult to supply the $V_{DS}$ required to write the cells. Furthermore, even if one or more of these over-erased cells are written, it is possible that deselected cells will be written in the process. Thus, the presence of over-erased cells disturbs the programming of the devices in the array.

Programming, as defined here, is the addition of negative charge to the floating gate such that the $V_{TH}$ of the cell increases. Erasure is the removal of negative charge from the floating gate such that the $V_{TH}$ of the cell decreases. Programming may be used to correct the over-erased state in which some of the cells have $V_{TH} \leq 0$ by programming all cells to some low $V_{TH\text{-}TAR}$ state that corresponds to the lowest logic state having the lowest $V_{TH}$. Additional logic states may be programmed to higher values of $V_{TH\text{-}TAR}$. For example, a conventional two state memory (logic 0 and logic 1) will have a $V_{TH\text{-}TAR}$ (0) and a $V_{TH\text{-}TAR}$ (1) such that $0 < V_{TH\text{-}TAR} (0) < V_{TH\text{-}TAR} (1)$. The target threshold voltage for the erase step, $V_{TH\text{-}TAR}$ (erase), will be less than or equal to $V_{TH\text{-}TAR}$ (0); this choice will ensure that all cells are erased to or below the logic 0 state prior to any programming step. In the following, $V_{TH\text{-}TAR}$ is the target threshold for either the program or the erase cycle in which $V_{TH}$ is to either be increased to the $V_{TH\text{-}TAR}$ corresponding to any of the logic states or reduced to the erased threshold voltage, respectively.

Also, due to variations among individual devices, sense amplifier variations, uniformity of program convergence, changes in ambient temperature during programming, etc., it is desirable, and sometimes necessary, to verify that the NOR array has been correctly programmed or correctly erased. Such verification is often required to ensure that each device in the array has the desired amount of charge on the floating gate. However, the conditions used to verify the amount of charge on the floating gate of a selected device do not provide reliable information about the charge state of the selected device if there are over-erased cells in the array. If the read is not accurate, it is not known whether or not the device was programmed or erased properly. Accordingly methods for programming or erasing the floating gate of the EEPROM devices in NOR arrays which are less susceptible to errors caused by over-erased cells are desired. A method for programming floating gate EPROM and EEPROM devices in NOR arrays in which the charge on the floating gate can be verified more accurately is desired.

SUMMARY OF THE INVENTION

The present invention is directed to a process for programming or verifying either the program or erasure of stacked gate memory devices in a NOR array. The aspects of the present invention directed to programming and program verify are applicable to EPROM and EEPROM devices. The aspects of the present invention directed to erase and erase verify are applicable to EEPROM devices only. In the context of the present invention, the charge on the floating gate of the device is verified periodically during either programming or erasure. In order to accurately program the device, or to accurately or efficiently verify the charge on the floating gate of the device being programmed or erased, a condition is applied to the other devices in the array to ensure that the other devices do not disturb the programming or the accuracy of the verification.

For ease of description, the present invention is described in terms of n-channel devices. Consequently, all of the biases and inequalities (e.g. $V_{CD} > 0$) described below are for n-channel devices. One skilled in the art will appreciate that, for p-channel devices, all of the expressed biases and inequalities are opposite in sign from those expressed for n-channel devices, but the same in absolute value.

For example, in the programming cycle of the present invention, a cell in the array is selected by application of a $V_{CS} > 0$ (via the word line for the selected cell) and a $V_{DS} > 0$ (via the bit line for the selected cell). More than one device can be programmed at a time by applying the prescribed $V_{DS}$ to more than one bit line. Typically $V_{CS}$ is greater than zero volts and less than 10 volts and $V_{DS}$ is greater than zero volts and less than 5 volts. The $V_{BS}$ that is applied to the whole array is less than or equal to zero. The other cells in the array are deselected by the application of a $V_{CS}$ that is less than or equal to 0 (via the word lines for the deselected cells). At least one of $V_{CS}$ and $V_{BS}$ is less than zero.

In the context of the present invention, deselected word line(s) or bit line(s) are the word lines or bit line(s) that are not connected to the selected device. In the embodiments wherein the $V_{CS}$ applied to the deselected devices is negative, $V_{CS}$ cannot be too negative, or previously programmed cells in the array will be more susceptible to erroneous erasure (by tunneling). In this regard a $V_{CS}$ that is about $-2$ volts to less than zero volts is contemplated as suitable. Even overerased cells with a $V_{TH}$ less than or equal to zero can be deselected when $V_{CS} \leq V_{TH} \leq 0$. Consequently, having a $V_{CS} < 0$ reduces the chance of having over-erased cells cause an erroneous read or program.

As the device is programmed, the charge of the floating gate is verified (i.e., conditions are applied to "read" the charge on the floating gate) periodically to determine if the charge on the floating gate is at or above the desired programming state for that device. The desired programming state is $V_{TH-TAR}$. Consequently, the objective of the program-verify step is to determine whether or not the $V_{TH}$ of the selected cell is at or sufficiently near $V_{TH-TAR}$. One skilled in the art will recognize that it is advantageous if $V_{TH}$ is equal to $V_{TH-TAR}$ although it is acceptable to have a $V_{TH}$ that slightly exceeds $V_{TH-TAR}$ and still get adequate performance from the programmed memory. The amount to which $V_{TH}$ can exceed $V_{TH-TAR}$ will depend upon the operating tolerances of the particular device. In this regard, it is not desirable for $V_{TH}$ to be less than $V_{TH-TAR}$.

During the program-verify step, the $V_{CS}$ that is applied to the selected device is equal to or higher than $V_{TH-TAR}$ (but less than the $V_{CS}$ used to program the device). During the program-verify step, the application of at least one of a negative $V_{BS}$ to the selected cells (typically, the negative $V_{BS}$ is applied to all of the devices in the array and not just the selected cell) and a $V_{CS}$ that is less than zero to the deselected cells is maintained. If, during the program-verify step, the $V_{TH}$ of the selected cells is determined to be less than $V_{TH-TAR}$, the program\program-verify cycle is continued. When, during the program-verify step, the $V_{TH}$ is determined to be equal to or greater than $V_{TH-TAR}$, programming of that particular cell is completed. It is advantageous if, when the programmed array is read, the $V_{CS}$ applied to the deselected devices is the same as the $V_{CS}$ that is applied to the deselected devices during the programming. It is also advantageous if $V_{BS}$ for the program step is the same as the $V_{BS}$ for the program-verify step.

Some devices are programmed by conditions that require the application of a negative substrate bias. Exemplary conditions for programming an EEPROM device using a negative $V_{BS}$ are described in U.S. Pat. No. 5,569,504 to Bude et al., which is hereby incorporated by reference. Regardless of whether $V_{BS}$ is less than zero or equal to zero, the same $V_{BS}$ is applied to all devices in a given array.

When devices are programmed using a negative substrate bias ($V_{BS}$), the negative substrate bias is also applied when reading the cell during the program-verify step. An accurate program-verify is performed despite the fact that the application of a negative substrate bias during the program-verify shifts the $V_{TH-TAR}$ by the body effect shift (i.e. the relationship between the substrate bias and the threshold voltage of the device as determined by a given sensing scheme). The body effect shift is zero when $V_{BS}$ is equal to zero. In the device arrays of the present invention, the shift in $V_{TH-TAR}$ caused by the body effect shift does not vary substantially from cell to cell. Thus, once the body effect shift in $V_{TH-TAR}$ is determined for one cell in a particular array, the program-verify of $V_{TH-TAR}$ is performed using a $V_{CS}$ for selected cells that is equal to $V_{TH-TAR}$ plus that body effect shift. The same body effect shift is used when verifying each cell. This is advantageous because switching the substrate bias on for programming and switching it off for the program-verify consumes both power and time. This is why the negative $V_{BS}$ is not used for the program-verify step when a zero $V_{BS}$ is used to program the device.

In the embodiments of the present invention wherein the devices are programmed using a negative $V_{BS}$, the program-verify is performed by applying to the selected device: 1.) a negative $V_{BS}$ that is about the same as the $V_{BS}$ that is applied to the device during programming; 2.) a control gate bias ($V_{CS}$) that is equal to $V_{TH-TAR}$ plus the body effect shift; and 3.) a $V_{DS}$ that is greater than zero.

It is advantageous if both the $V_B$ and $V_S$ for the program-verify step are about the same as both the $V_B$ and $V_S$ for the programming step. One skilled in the art will recognize that, the greater the difference between these values during program and program-verify, the greater the amount of power and time the program-verify will require. It is therefore advantageous to keep these values about the same during programming and program-verify in order to keep the power and the time required for the program-verify within acceptable limits.

In a second embodiment of the present invention, it is advantageous if a negative $V_{CS}$ is applied to the word lines of the deselected devices in the array (i.e., the word lines other than the word line of the selected device as described above) during either programming, program-verify, or erase verify. In the process of the present invention, it is advantageous to apply the negative $V_{CS}$ to the deselected cells when the cells are programmed using a negative $V_{BS}$ or when the cells are programmed using a $V_{BS}$ equal to zero.

For example, if the program conditions for the selected cell are: $V_{BS}=0$; $V_{CS}>0$, and $V_{DS}>0$; then the conditions applied to the de-selected cells during programming are: $V_{BS}=0$; $V_{CS}<0$, and $V_{DS}=0$. If the program verify conditions are: $V_{BS}=0$; $V_{CS}=V_{TH-TAR}$; and $V_{DS}>0$; then the conditions applied to the de-selected cells during program verify are: $V_{BS}=0$; $V_{CS}<0$, and $V_{DS}=0$. In these examples, the device is programmed and the programming is verified without using a negative $V_{BS}$.

If the program conditions are: $V_{BS}<0$; $V_{CS}>0$, and $V_{DS}>0$; then the conditions applied to the de-selected cells during programming are: $V_{BS}<0$; $V_{CS}<0$, and $V_{DS}=0$. If the program verify conditions are: $V_{BS}<0$; $V_{CS}=V_{TH-TAR}+$body effect shift; and $V_{DS}>0$; then the conditions applied to the de-selected cells during program verify are: $V_{BS}<0$; $V_{CS}<0$, and $V_{DS}=0$. In these examples, the device is programmed and the programming is verified with a negative $V_{BS}$.

In other embodiments of the present invention, an erase-verify is performed to determine when erasure is complete. Erase is complete when all cells have a $V_{TH}$ that is $\leq V_{TH-TAR}$ for erase. $V_{TH-TAR}$ for erase will in general be less than the $V_{TH-TAR}$ for program. When the array is erased, the charge on the floating gate of each device is first verified. Verification is performed using the above-described conditions. The erase-verify is also performed by applying one of either a negative $V_{BS}$ to the devices in the array and a control gate bias ($V_{CS}$) that is sum of the target threshold voltage ($V_{TH-TAR}$) of the device and the body effect, a negative $V_{CS}$ to the deselected cells, or both. However, because the same power and time considerations for the program-verify are not presented in the context of an erase-verify, there is no requirement or advantage for the $V_B$ and the $V_S$ during the erase verify to be about the same as both the $V_B$ and $V_S$ of the erase.

The application of a negative $V_{CS}$ to deselected cells or negative $V_B$ to all cells prevents current from passing through the deselected devices to the selected bit line. By preventing this leakage current from passing through the over-erased devices, errors in verifying the charge on the floating gate of the devices is avoided.

DETAILED DESCRIPTION

Figure 1:
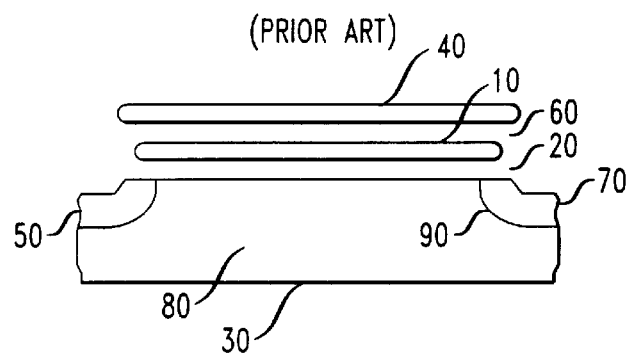
FIG. 1 is a schematic illustration of a stacked gate EEPROM device.
Figure 2:
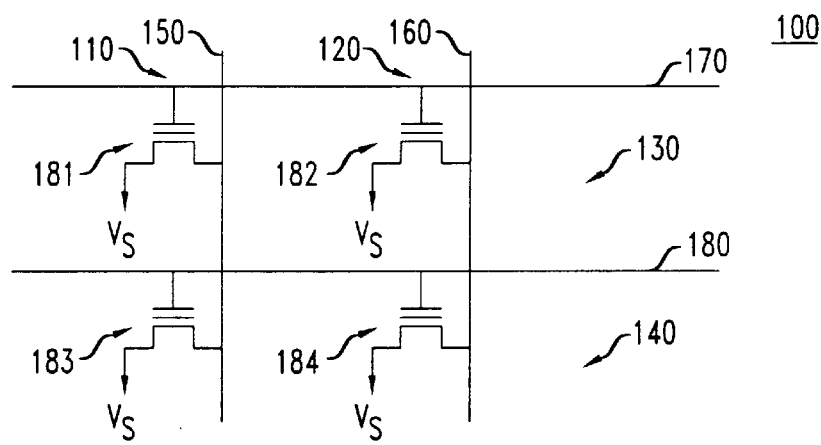
FIG. 2 is a schematic illustrate of a NOR array of devices.

The present invention is directed to a process for programming and erasing stacked gate devices in a NOR array and for verifying the charge on the floating gate of individual devices in the NOR array when either erasing or programming the device. A basic NOR array is illustrated in FIG. 2. The NOR array 100 has two columns, 110 and 120 and two rows, 130 and 140. Each column of devices, 110 and 120, has a bit line, 150 and 160, respectively, associated therewith. Each row of devices, 130 and 140, has a word line 170 and 180, respectively, associated therewith. The devices in the array 100 are 181, 182, 183 and 184. The drain of each device, 181, 182, 183, and 184, is connected to the bit line for the particular device. The gate of each device, 181, 182, 183, and 184, is connected to the drain line for the particular device. The devices 181, 182, 183, and 184, have a common $V_B$ and $V_S$.

In a conventional NOR array, a device is selected by applying a certain voltage to one word line and at least one bit line. For convenience in this description, operation of a simple array is described in which voltage is applied to only one of the bit lines in the array at a time.

For example, referring to FIG. 2, device 181 is selected by applying a voltage greater than zero on word line 170 and a voltage greater than zero on bit line 150 while keeping the voltages on bit line 160 and word line 180 equal to zero. Thus, the device, 181, at the intersection of bit line 150 and word line 170 is selected. The other three devices (182, 183, and 184) are "deselected."

In the process of the present invention, programming or erasing a selected device is accomplished by periodically verifying the charge on the floating gate of the device as the device is programmed or erased. During the program-verify and erase-verify steps, it is determined whether or not the actual $V_{TH}$ of the device is the $V_{TH\text{-}TAR}$ of the device for the program or erase step ($V_{TH\text{-}TAR}$ is different for program and erase and $V_{TH\text{-}TAR}$ (program) $\geq V_{TH\text{-}TAR}$ (erase)). Consequently, the verify step is a read step that is performed periodically during the programming or erasure of an array of memory cells.

In a standard read step, the cell is read using a $V_{DS} > 0$, a $V_{CS}$ that is greater than or equal to $V_{TH\text{-}TAR}$ (erase) but less than or equal to $V_{TH\text{-}TAR}$ (program) (i.e. $V_{TH\text{-}TAR}$ (erase) $\leq V_{CS} \leq V_{TH\text{-}TAR}$ (program)), and a $V_{BS}=0$. In the process of the present invention, conditions are applied to either the selected device in the array, the deselected devices in the array, or both during either the programming, the program-verify or the erase-verify that permit these steps to be performed efficiently and accurately.

In one aspect of the present invention, a negative $V_{BS}$ is used when verifying the charge on the floating gate during the program verify for devices programmed using a negative $V_{BS}$. This permits the verification to be done more efficiently, because there is no need to switch from a negative $V_{BS}$ during programming to a zero $V_{BS}$ during verification (which consumes both time and energy). Since the application of a negative $V_{BS}$ causes a body effect shift in the $V_{TH}$ of the device, the $V_{CS}$ that is applied to the selected device during the verify must be the sum of $V_{TH\text{-}TAR}$ and the body effect shift (denoted $\gamma(V_{BS})$). Adjusting $V_{CS}$ in this manner during verification ensures that, when the memory array is read during normal operations using a $V_{BS}$ equal to zero (as opposed to read in the context of verification in a program or erase cycle), the correct result is obtained.

In another aspect of the present invention, a negative $V_{CS}$ is applied to the deselected devices in the array during programming, program-verify, or erase-verify. The application of the negative $V_{CS}$ avoids errors in the programming or verification of the $V_{TH\text{-}TAR}$ of the selected cells. A summary of the conditions contemplated by the present invention is provided in the following Table 1.

TABLE 1

| | Program Verify Cycle | | | |
|---|---|---|---|---|
| | Program Conditions | | Program Verify Conditions | |
| Method | Selected Cells | Deselected Cells | Selected Cells | Deselected Cells |
| A | VBS = VBS-PROG | VBS is same as for | VBS < 0 | VBS is same as for |
| VBS < 0 | VBS-PROG < −0.5 | selected cells | Advantageous if VBS = VBS-PROG | selected cells |
| | VCS > 0 | VCS = 0 | VCS = VTH-TAR + γ (VBS) | VCS = 0 |
| | VDS > 0 | VDS = 0 | VDS > 0 | VDS = 0 |
| B | VBS = 0 | VBS = 0 | VBS = 0 | VBS = 0 |
| VCS < 0 | VCS > 0 | VCS < 0 | VCS = VTH-TAR | VCS < 0 |
| Deselect | VDS > 0 | VDS = 0 | VDS > 0 | VDS = 0 |
| C | VBS = VBS-PROG < −0.5 | VBS is same as for | VBS < 0 | VBS is same as for |
| VBS < 0 | VBS-PROG < −0.5 | selected cells | Advantageous if VBS = VBS-PROG | selected cells |
| and | VCS > 0 | VCS < 0 | VCS = VTH-TAR + γ (VBS) | VCS < 0 |
| VCS < 0 | VDS > 0 | VDS = 0 | VDS > 0 | VDS = 0 |

| | Erase Verify Cycle | | |
|---|---|---|---|
| | Erase Conditions Flash Erase (all cells erased | Erase Verify Conditions | |
| Method | simultaneously) | Selected Cells | Deselected Cells |
| D | VCS << 0 and/or | VBS < 0 | VBS same as for |
| VBS < 0 | VCD << 0 and/or | VCS = VTH-TAR + γ (VBS) | selected cells |
| de- | VCB << 0 | VDS > 0 | VCS = 0 |

TABLE 1-continued

| select E VCS < 0 de- select | VCS << 0 and/or VCD << 0 and/or VCB << 0 | VBS = 0 VCS = VTH-TAR VDS > 0 | VDS = 0 VBS = 0 VCS < 0 VDS = 0 |
|---|---|---|---|
| F VBS < 0 & VCS < 0 de- select | VCS << 0 and/or VCD << 0 and/or VCB << 0 | VBS < 0 Advantageous if VBS = VBS-PROG VCS = VTH-TAR + γ (VBS) VDS > 0 | VBS same as for selected cells VCS < 0 VDS = 0 |

The $V_{DS}$ applied to the selected cells during the program verify is typically about 0.8V to 1.5V. The $V_{DS}$ applied to the selected cells during the programming is about 2.5V to about 6V. The $V_{CS}$ applied to the selected cells during programming is typically about 2V to about 12V. The $V_{BS\text{-}PROG}$ is typically about −2V to about −3V.

Examples of $V_{CS}$, $V_{CD}$ or $V_{CB}$ during erase are about −15 to about −20V. One skilled in the art will appreciate that the specific voltages applied to the array during the erase will depend upon coupling between the floating gate and the control gate and the thickness of the gate oxide.

Figure 3:
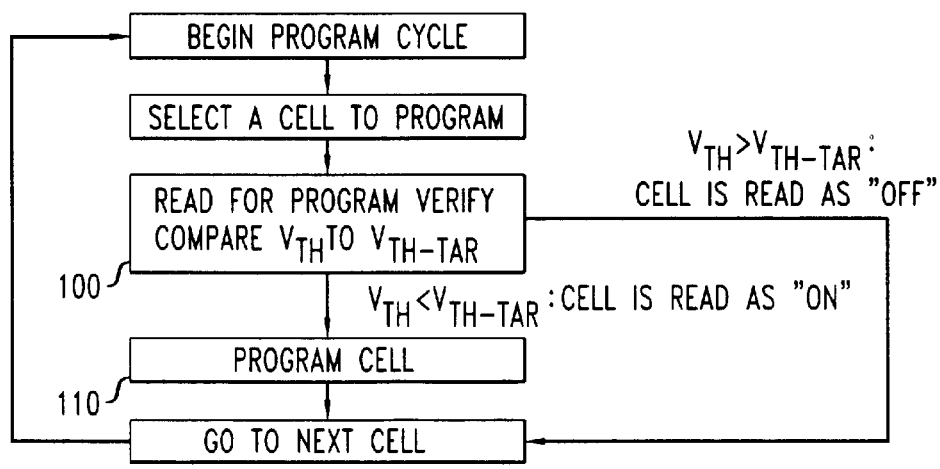
FIG. 3 is an outline of a process for programming a device in which the charge of the floating gate is verified during programming.

A flow diagram of a programming cycle of one aspect of the present invention is illustrated in FIG. 3. The cycle is commenced by reading the selected cell to determine the threshold voltage ($V_{TH}$) (i.e., the charge on the floating gate) and comparing it with $V_{TH\text{-}TAR}$ (the program verify step 100). The program verify is performed by applying a $V_{CS}$ to the selected device that is equal to or greater than the desired $V_{TH}$ of the selected device. If, during the program verify step 100, it is determined that $V_{TH}$ is less than $V_{TH\text{-}TAR}$, then conditions are applied to program the cell (the program step 110). Periodically during programming, the verify step is performed to check the charge on the floating gate. The cycle of (1) program-verify and (2) program is continued until the $V_{TH}$ of the device equals or exceeds $V_{TH\text{-}TAR}$. When, during the program-verify, it is determined that the device $V_{TH}$ is equal to or greater than $V_{TH\text{-}TAR}$, then another cell is selected for programming in step 120.

The steps of the cycle described in FIG. 3 can be applied to one or more than one cell on a given word line at one time. However, the steps of the cycle cannot be performed simultaneously on cells on different word lines in the same array.

The conditions under which the device is read during the cycle depicted in FIG. 3 will depend upon the programming conditions. If the device is programmed using a $V_{CS}$ and a $V_{DS}$ greater than zero and a zero substrate bias ($V_{BS}$), then the program-verify is performed using a $V_{CS}$ that is equal to or greater than the desired $V_{TH}$. The $V_{DS}$ during the program-verify is less than the $V_{DS}$ during programming ($0 \leq V_{DS} \leq 1.5$) and the $V_{BS}$ is zero.

If the device is programmed using a $V_{CS}$ and a $V_{DS}$ greater than zero and a negative substrate bias (e.g. a $V_{BS}$ that is −0.5 V or more negative), then the read-verify is performed using a $V_{CS}$ that is equal to or greater than the desired $V_{TH}$ plus the body effect shift ($\gamma(V_{BS})$). The body effect shift is the threshold voltage shift caused by the negative substrate bias determined by a given sensing scheme. Since this threshold voltage shift is uniform for all of the devices in the array, devices are read by applying a $V_{CS}$ that is equal to or greater than the sum of $V_{TH}$ and the body effect where the same value of the body effect shift is used for all cells. The $V_{BS}$ during the program-verify is the same as the $V_{BS}$ during programming.

In some embodiments of the present invention, it is advantageous to apply a negative $V_{CS}$ to all of the other word lines in the array. Referring to the array depicted in FIG. 2, the negative $V_{CS}$ is applied only to the word line 180 to which the selected device 181 is not connected. The advantages provided by the application of a negative $V_{CS}$ to the deselected cells (i.e. an accurate program or verify) are obtained regardless of whether the $V_{BS}$ is zero or negative.

In the flow diagram depicted in FIG. 3, the device is subjected to a read-verify before programming. In an alternate embodiment, the device is not subjected to a program-verify until after the device has been programmed for some selected time interval.

Figure 4:
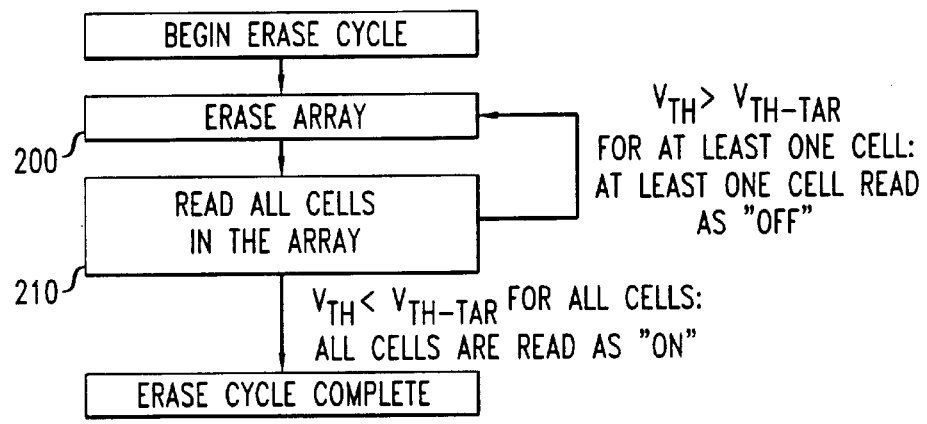
FIG. 4 is an outline of a process for erasing a NOR array in which the charge on the floating gate of individual devices in the array is verified during erasure.

A flow diagram of an erasing cycle of the present invention is illustrated in FIG. 4. The cycle is commenced by subjecting all of the cells in the array to a condition 200 that erases charge from the floating gate, thereby making the floating gate more positively charged. A summary of suitable conditions for erasing an array of memory cells is provided in Table 1 above. After the cells are erased, a verify step 210 is performed on each cell individually to determine the charge on the floating gate.

In one embodiment of the erase-verify cycle of the present invention, the verify step is performed by applying a negative $V_{BS}$ to all the cells (a negative $V_{BS}$ is not used to erase the array). If the verify is performed using a negative $V_{BS}$, then the $V_{CS}$ that is applied to the selected cell during the verify step is equal to $V_{TH\text{-}TAR}$ plus $\gamma(V_{BS})$. In this embodiment, the $V_{CS}$ that is applied to the deselected cells during the read verify is zero. The application of a negative $V_{BS}$ to the cell being read during read-verify ensures that, if any over-erased cells are present in the array, these over erased cells will not provide sufficient bit-line leakage to cause a cell that should read as "off" to read as "on." The negative $V_{BS}$ is applied during the erase verify, regardless of whether or not a negative $V_{BS}$ is used to program the cells. Since the array is erased all at once, and not cell by cell, switching the cells between the erase conditions and a negative $V_{BS}$ for erase verification does not consume significant amounts of time or power (as it would if a cell were programmed without a negative $V_{BS}$ and subsequently verified using a negative $V_{BS}$).

In a second embodiment of the erase-verify cycle, a $V_{CS}$ that is equal to $V_{TH\text{-}TAR}$ (erase) is applied to the selected device in the erase-verify step and a negative $V_{CS}$ is applied to the deselected devices during the erase-verify step. In a third embodiment, a negative $V_{BS}$ is applied to both the selected and deselected cells during the erase-verify, a $V_{CS}$ equal to $V_{TH\text{-}TAR}+\gamma(V_{BS})$ is applied to the selected device, and a negative $V_{CS}$ is applied to the deselected devices.

If, during the erase-verify step of the erase cycle, it is determined that $V_{TH}$ of one or more of the devices in the array is greater than $V_{TH\text{-}TAR}$ (erase), then the array is erased some more. Periodically during erasure, the erase-verify step is performed to check the charge on the floating gate. The cycle of (1) erase and (2) erase-verify is continued until the $V_{TH}$ of all of the devices in the array is below $V_{TH\text{-}TAR}$ (erase; typically $V_{TH\text{-}TAR}$ in the erase context is less than $V_{TH\text{-}TAR}$ in the program context). When, during the erase-verify step, it is determined that $V_{TH}$ of all of the cells in the array is equal to $V_{TH\text{-}TAR}$ (erase), then erasure is complete. The erase cycle commences with an erase followed by an erase-verify. Contrary to the programming cycle, it is not practical to reverse the order of the erase and read-verify steps.

In the present invention, the $V_{TH\text{-}TAR}$ used for the erase-verify is not required to the same as the $V_{TH\text{-}TAR}$ for the program-verify. In some embodiments the $V_{TH\text{-}TAR}$ (erase) is at least one volt less than the $V_{TH\text{-}TAR}$ (program). This ensures a threshold voltage margin between the zero and the 1 state. Typically, during normal read operations (as distinguished from the verify operations during programming or erasure), $V_{CS}$ will be approximately one-half of ($V_{TH\text{-}TAR}$ (erase)+$V_{TH\text{-}TAR}$ (write) ). $V_{TH\text{-}TAR}$ is always greater than zero.

EXAMPLE 1

The $V_{TH}$ of individual devices in an array of stacked gate devices was determined. The array was 256 devices by 256 devices. The devices were stacked gate EEPROM devices. The devices had a channel length of 0.48 microns. The $V_{TH}$ is a function of substrate bias ($V_{TH}$ ($V_{BS}$) ) of each cell was measured as follows. First, cells were read individually with $V_{BS}$=0. A given cell was selected for reading by applying a $V_{DS}$=0.8 and with various values of $V_{CS}$ (indexed by n, i.e., $V_{CS}$(n)) from 2V to 6V in increments of 50 mV. $V_{TH}$(0) of a given cell was determined as the lowest value of $V_{CS}$(n) for which the cell was read as "on" by the sense amplifier attached to the selected bit-line. The $V_{TH}$ of each cell was again determined by this procedure when the cells in the array were subjected to $V_{BS}$=-0.5 V, -1 V, -1.5 V, and -2 V yielding $V_{TH}$(-0.5), $V_{TH}$(-1), $V_{TH}$(-1.5), and $V_{TH}$(-2). A cell's body effect shift ($\gamma(V_{BS})$) was determined as $V_{TH}$ ($V_{BS}$)-$V_{TH}$(0).

Figure 5:
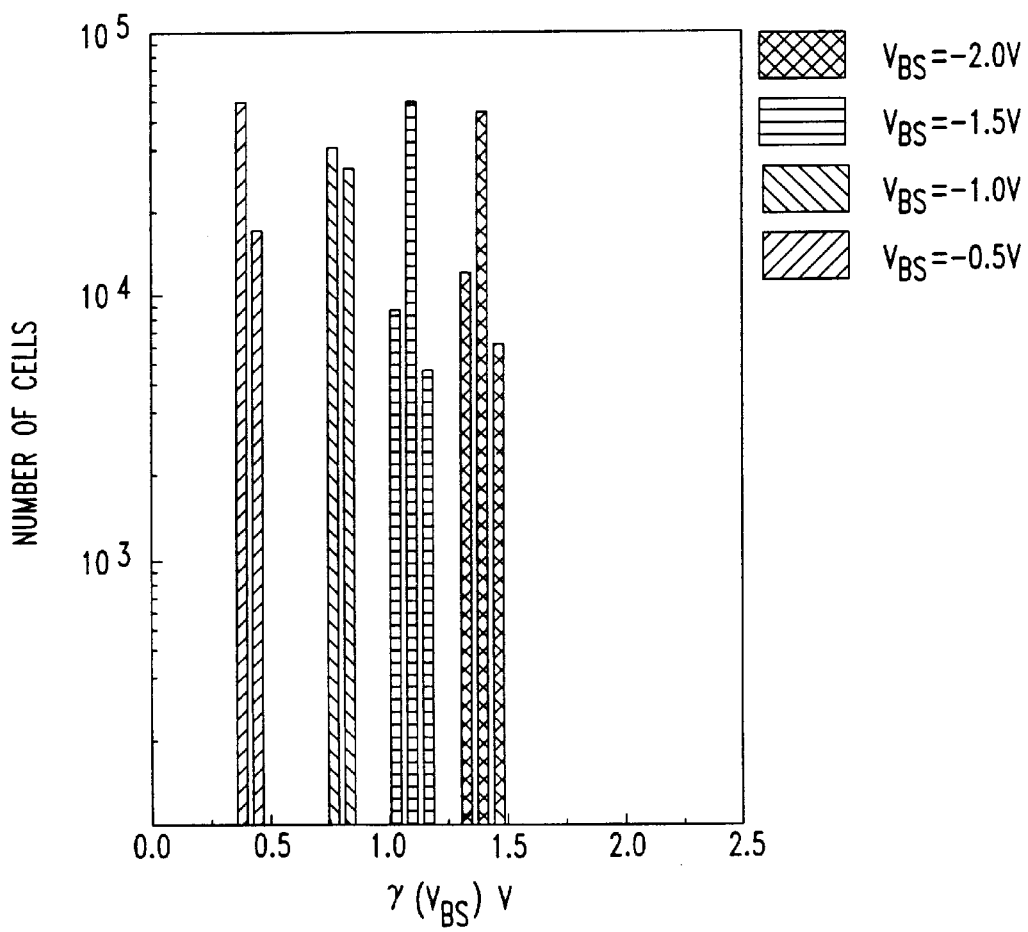
FIG. 5 is a histogram of the body effect shift of stacked gate memory devices in a NOR array when the array is subjected to four different values of negative $V_{BS}$ (−0.5 V, −1.0 V, −1.5 V, and −2.0 V).

FIG. 5 illustrates the number of cells in the array with a given body effect shift in 50 mV intervals. The body effect shift voltages fell within two fifty millivolt intervals for all of the devices in the array to which was applied a $V_{BS}$ of -0.5 V and -1 V. The body effect shift voltages fell within three fifty millivolt intervals for all of the devices in the array to which was applied a $V_{BS}$ of -1.5 V and -2 V. FIG. 5 illustrates that, for a given negative $V_{BS}$, the body effect shift to the threshold voltage of the devices varies little from device to device in the array of devices. Thus, FIG. 5 demonstrates that a cell's $V_{TH}$ (which is $V_{TH\text{-}TAR}$ under normal read conditions of $V_{BS}$=0), is determined by verifying that its $V_{TH}$ when read with $V_{BS}$<0 is $V_{TH\text{-}TAR}+\gamma$ ($V_{BS}$), where $\gamma(V_{BS})$ is a single value chosen for every cell in the entire array.

What is claimed is:

1. A process for changing the charge on the floating gate of a plurality of stacked-gate memory devices in a NOR array comprising:

verifying whether a $V_{TH}$ of at least one device on a selected word line in an array of devices is above or below a target threshold voltage, wherein the at least one device is the selected device in an array of devices and wherein the devices other than the selected device in the array are the deselected devices, by applying, to an n-channel device, a $V_{BS}$ that is equal to or less than zero to the selected and deselected devices and a $V_{CS}$ that is less than or equal to zero to the deselected devices and wherein at least one of $V_{BS}$ and $V_{CS}$ is less than zero, and, to a p-channel device, a $V_{BS}$ that is equal to or greater than zero to the selected and deselected devices and a $V_{CS}$ that is greater than or equal to zero to the deselected devices and wherein at least one of $V_{BS}$ and $V_{CS}$ is greater than zero; and if the $V_{TH}$ of the device is less than or greater than the target threshold voltage, subjecting the selected device to conditions that change the charge on the floating gate.

2. The process of claim 1 wherein the device is n-channel and $V_{BS}$ is less than zero and the $V_{CS}$ that is applied to the deselected devices is equal to zero, and wherein the $V_{CS}$ that is applied to the selected device during the verify is equal to the target threshold voltage plus a body effect shift.

3. The process of claim 2 further comprising determining a body effect shift for the devices in the array of devices.

4. The process of claim 2 wherein the conditions that change the charge on the floating gate are programming conditions comprising applying a negative $V_{BS}$ to the selected and deselected devices, a $V_{CS}$ that is greater than zero to the selected device and a $V_{CS}$ that is equal to zero to the deselected devices, and wherein these programming conditions are applied when the $V_{TH}$ of the device is less than the target threshold voltage.

5. The process of claim 2 wherein the memory devices are EEPROM devices and the conditions that change the charge on the floating gate are erasing conditions and wherein these erasing conditions are applied when the $V_{TH}$ of the device is greater than the target threshold voltage.

6. The process of claim 1 wherein the device is n-channel and $V_{BS}$ is zero and the $V_{CS}$ that is applied to the deselected devices is less than zero, and wherein the $V_{CS}$ that is applied to the selected device is equal to the target threshold voltage.

7. The process of claim 6 wherein the conditions that change the charge on the floating gate are programming conditions comprising applying a $V_{BS}$ that is equal to zero to the selected and deselected devices, a $V_{CS}$ that is greater than zero to the selected device and a $V_{CS}$ that is less than zero to the deselected devices, and wherein these programming conditions are applied when the $V_{TH}$ of the device is less than the target threshold voltage.

8. The process of claim 6 wherein the memory devices are EEPROM devices and the conditions that change the charge on the floating gate are erasing conditions and wherein these erasing conditions are applied when the $V_{TH}$ of the device is greater than the target threshold voltage.

9. The process of claim 1 wherein the device is n-channel and $V_{BS}$ is less than zero and the $V_{CS}$ that is applied to the deselected devices is less than zero, and wherein the $V_{CS}$ that is applied to the selected device during the verify is equal to the threshold voltage plus a body effect shift.

10. The process of claim 9 wherein the conditions that change the charge on the floating gate are programming conditions comprising applying a negative $V_{BS}$ to the selected and deselected devices, a $V_{CS}$ that is greater than zero to the selected device and a $V_{CS}$ that is less than zero to the deselected devices, and wherein these programming conditions are applied when the $V_{TH}$ of the device is less than the target threshold voltage.

11. The process of claim 9 wherein the memory devices are EEPROM devices and the conditions that change the charge on the floating gate are erasing conditions and wherein these erasing conditions are applied when the $V_{TH}$ of the device is greater than the target threshold voltage.

12. A process for changing the charge on the floating gate of a plurality of stacked-gate memory devices in a NOR array comprising:

verifying whether a $V_{TH}$ of at least one device on a selected word line in an array of devices is above or below a target threshold voltage, wherein the one device is the selected device in an array of devices and wherein the devices other than the selected device in the array are the deselected devices, by applying, for n-channel devices, a $V_{BS}$ that is less than zero to the selected and deselected devices, and, for p-channel devices, a $V_{BS}$ that is greater than zero to the selected and deselected devices; and if the $V_{TH}$ of the device is less than or greater than the target threshold voltage, subjecting the selected device to conditions that change the charge on the floating gate.

13. The process of claim 12 further comprising, for n-channel devices, applying a $V_{CS}$ to the deselected device that is less than zero, and wherein the $V_{CS}$ that is applied to the selected device during the verify is equal to the target threshold voltage plus a body effect shift.

14. The process of claim 13 further comprising determining a body effect shift for the devices in the array of devices.

15. The process of claim 13 wherein the $V_{CS}$ that is applied to the selected device is equal to the target threshold voltage.

16. The process of claim 13 wherein the conditions that change the charge on the floating gate are programming conditions comprising applying a negative $V_{BS}$ to the selected and deselected devices, a $V_{CS}$ that is greater than zero to the selected device and a $V_{CS}$ that is less than zero to the deselected devices and wherein these programming conditions are applied when the $V_{TH}$ of the device is less than the target threshold voltage.

17. The process of claim 13 wherein the memory devices are EEPROM devices and the conditions that change the charge on the floating gate are erasing conditions and wherein these erasing conditions are applied when the $V_{TH}$ of the device is greater than the target threshold voltage.

18. The process of claim 12 further comprising, for n-channel devices, applying a $V_{CS}$ to the deselected device that is equal to zero, and wherein the $V_{CS}$ that is applied to the selected device during the verify is equal to the target threshold voltage plus a body effect shift.

19. The process of claim 18 wherein the conditions that change the charge on the floating gate are programming conditions comprising applying a negative $V_{BS}$ to the selected and deselected devices, a $V_{CS}$ that is greater than zero to the selected device and a $V_{CS}$ that is equal to zero to the deselected devices and wherein these programming conditions are applied when the $V_{TH}$ of the device is less than the target threshold voltage.

20. The process of claim 18 wherein the memory devices are EEPROM devices and the conditions that change the charge on the floating gate are erasing conditions and wherein these erasing conditions are applied when the $V_{TH}$ of the device is greater than the target threshold voltage.

21. A process for changing the charge on the floating gate of a plurality of stacked-gate memory devices in a NOR array comprising:

verifying whether a $V_{TH}$ of at least one device on a selected word line in an array of devices is above or below a target threshold voltage, wherein the at least one device is the selected device in an array of devices and wherein the devices other than the selected device in the array are the deselected devices, by applying, to an n-channel device, a $V_{CS}$ that is less than zero to the deselected devices, and, to a p-channel device, a $V_{CS}$ that is greater than zero to the deselected device; and if the $V_{TH}$ of the device is less than or greater than the target threshold voltage, subjecting the selected device to conditions that change the charge on the floating gate.

22. The process of claim 21 further comprising, for an n-channel device, applying a negative $V_{BS}$ to all of the devices in the array during the verifying step and wherein the $V_{CS}$ that is applied to the selected device during the verify is equal to the target threshold voltage plus a body effect shift.

23. The process of claim 22 further comprising determining a body effect shift for the devices in the array of devices.

24. The process of claim 22 wherein the conditions that change the charge on the floating gate are programming conditions comprising applying a negative $V_{BS}$ to the selected and deselected devices and a $V_{CS}$ that is greater than zero to the selected device, and wherein these programming conditions are applied when the $V_{TH}$ of the device is less than the target threshold voltage.

25. The process of claim 22 wherein the memory devices are EEPROM devices and the conditions that change the charge on the floating gate are erasing conditions and wherein these erasing conditions are applied when the $V_{TH}$ of the device is greater than the target threshold voltage.

26. The process of claim 21 further comprising, for an n-channel device, applying a $V_{BS}$ equal to zero to all of the devices in the array during the verifying step, and wherein the $V_{CS}$ that is applied to the selected device is equal to the target threshold voltage.

27. The process of claim 26 wherein the conditions that change the charge on the floating gate are programming conditions comprising applying a $V_{BS}$ that is equal to zero to the selected and deselected devices and a $V_{CS}$ that is greater than zero to the selected device, and wherein these programming conditions are applied when the $V_{TH}$ of the device is less than the target threshold voltage.

28. The process of claim 26 wherein the memory devices are EEPROM devices and the conditions that change the charge on the floating gate are erasing conditions and wherein these erasing conditions are applied when the $V_{TH}$ of the device is greater than the target threshold voltage.

* * * * *